US010732863B2

(12) United States Patent
Kodera et al.

(10) Patent No.: US 10,732,863 B2
(45) Date of Patent: Aug. 4, 2020

(54) MEMORY SYSTEM STORING BLOCK PROTECTION INFORMATION

(71) Applicant: Toshiba Memory Corporation, Tokyo (JP)

(72) Inventors: Shunsuke Kodera, Yokohama Kanagawa (JP); Kenichirou Kada, Yokohama Kanagawa (JP); Shinya Takeda, Yokohama Kanagawa (JP); Kiyotaka Hayashi, Kawasaki Kanagawa (JP); Yoshio Furuyama, Yokosuka Kanagawa (JP); Tetsuya Iwata, Yokohama Kanagawa (JP); Wangying Lin, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/439,712

(22) Filed: Feb. 22, 2017

(65) Prior Publication Data
US 2018/0024763 A1    Jan. 25, 2018

(30) Foreign Application Priority Data
Jul. 22, 2016   (JP) .................................. 2016-144747

(51) Int. Cl.
*G11C 7/24*     (2006.01)
*G06F 3/06*     (2006.01)
(Continued)

(52) U.S. Cl.
CPC ............ *G06F 3/0622* (2013.01); *G06F 3/064* (2013.01); *G06F 3/0637* (2013.01);
(Continued)

(58) Field of Classification Search
CPC .. G06F 3/0622; G06F 12/1425; G06F 3/0659; G06F 3/064; G06F 3/0637; G06F 3/0679; G06F 2212/7207; G06F 2212/214; G06F 2212/1052; G11C 7/24; G11C 11/1695; G11C 11/2295; G11C 11/4078
See application file for complete search history.

(56) References Cited

U.S. PATENT DOCUMENTS 5,673,222 A    9/1997  Fukurnoto et al.
7,307,894 B2   12/2007 Kido et al.
(Continued)

FOREIGN PATENT DOCUMENTS

JP    2006-127648      5/2006
JP    2014-38593 A     2/2014

OTHER PUBLICATIONS

Toshiba Datasheet TC58NVG0S3HTA00, Aug. 31, 2012.
Toshiba Datasheet TC58BVG0S3HTA00, Aug. 31, 2012.

*Primary Examiner* — Khamdan N. Alrobaie
(74) *Attorney, Agent, or Firm* — Kim & Stewart LLP

(57) ABSTRACT

A memory system includes a controller that recognizes, as a command, a signal received immediately after a chip select signal is received from a host device, and a memory that includes a plurality of blocks. When the command is a first command, the controller outputs to the host device, information indicating whether at least one of a write operation and an erase operation with respect to at least one particular block is prohibited.

14 Claims, 11 Drawing Sheets

(51) Int. Cl.
*G06F 13/16* (2006.01)
*G06F 12/14* (2006.01)

(52) U.S. Cl.
CPC .......... *G06F 3/0659* (2013.01); *G06F 3/0679* (2013.01); *G06F 12/1425* (2013.01); *G06F 13/16* (2013.01); *G11C 7/24* (2013.01); *G06F 2212/1052* (2013.01); *G06F 2212/214* (2013.01); *G06F 2212/7207* (2013.01)

(56) References Cited

U.S. PATENT DOCUMENTS

| | | | |
|---|---|---|---|
| 7,310,277 B2 | 12/2007 | Komiya et al. | |
| 8,111,551 B2 | 2/2012 | Tanaka et al. | |
| 10,002,652 B1* | 6/2018 | Seong | G11C 13/0059 |
| 2002/0051375 A1* | 5/2002 | Kim | G11C 5/025 |
| | | | 365/51 |
| 2002/0174310 A1* | 11/2002 | Ueyama | G06F 12/1425 |
| | | | 711/163 |
| 2003/0149851 A1* | 8/2003 | Shiota | G06F 12/1425 |
| | | | 711/163 |
| 2005/0213421 A1* | 9/2005 | Polizzi | G06F 13/4234 |
| | | | 365/232 |
| 2005/0276125 A1* | 12/2005 | Kido | G11C 16/22 |
| | | | 365/189.05 |
| 2009/0113118 A1* | 4/2009 | Lee | G06F 12/0246 |
| | | | 711/103 |
| 2011/0222330 A1* | 9/2011 | Lee | G11C 13/0004 |
| | | | 365/100 |
| 2012/0124446 A1 | 5/2012 | Pekny et al. | |
| 2013/0268802 A1* | 10/2013 | Ito | G06F 11/0796 |
| | | | 714/6.11 |
| 2013/0346671 A1 | 12/2013 | Michael et al. | |
| 2014/0258599 A1* | 9/2014 | Rostoker | G06F 12/0246 |
| | | | 711/103 |
| 2017/0060484 A1 | 3/2017 | Kodera et al. | |

* cited by examiner

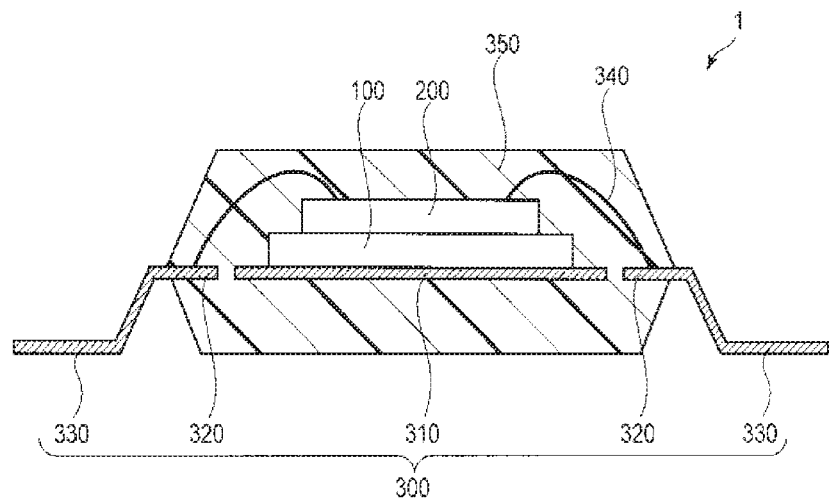

| Pin no. | Pin function |
|---|---|
| 1 | Hold input(/HOLD) / serial data output3(SO3) |
| 2 | Power supply(Vcc) |
| 3 | No connection(NC) |
| 4 | No connection(NC) |
| 5 | No connection(NC) |
| 6 | No connection(NC) |
| 7 | Chip select(/CS) |
| 8 | Serial data output(SO) / serial data output1(SO1) |
| 9 | Write protect(/WP) / serial data output2(SO2) |
| 10 | Ground(Vss) |
| 11 | No connection(NC) |
| 12 | No connection(NC) |
| 13 | No connection(NC) |
| 14 | No connection(NC) |
| 15 | Serial data input(SI) / serial data output0(SO0) |
| 16 | Serial clock input(SCK) |

| Pin no. | Pin function |
|---|---|
| 1 | Chip select(/CS) |
| 2 | Serial data output(SO) / serial data output1(SO1) |
| 3 | Write protect(/WP) / serial data output2(SO2) |
| 4 | Ground(Vss) |
| 5 | Serial data input(SI) / serial data output0(SO0) |
| 6 | Serial clock input(SCK) |
| 7 | Hold input(/HOLD) / serial data output3(SO3) |
| 8 | Power supply(Vcc) |

FIG. 16
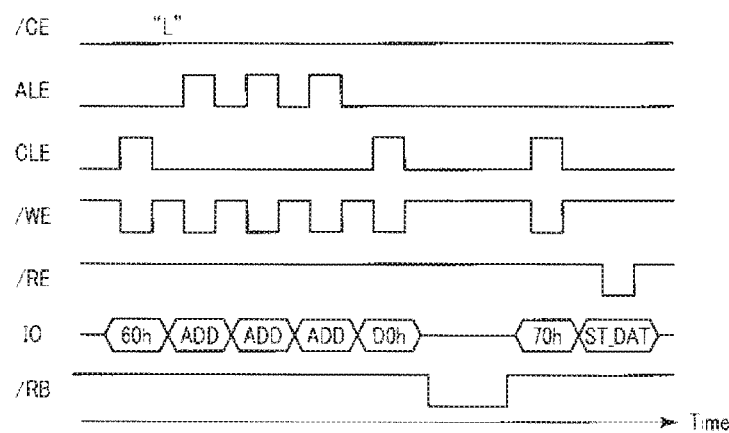
FIG. 17
| Block address | Flag |
|---|---|
| 0 | 0 |
| 1 | 0 |
| 2 | 1 |
| ⋮ | ⋮ |
| 1023 | 0 |
FIG. 18
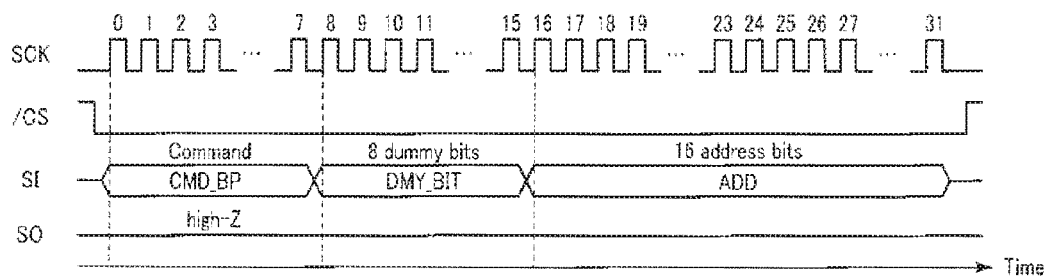

| Address | Bit | | | | | | | |
|---|---|---|---|---|---|---|---|---|
| | 7 | 6 | 5 | 4 | 3 | 2 | 1 | 0 |
| C8h | Reserved | Reserved | Reserved | Reserved | Reserved | Reserved | Reserved | BPS0 |

| BPS0 | Protect Area |
|---|---|
| 0 | Not Protected |
| 1 | Protected |

| Address | Bit | | | | | | | |
|---|---|---|---|---|---|---|---|---|
| | 7 | 6 | 5 | 4 | 3 | 2 | 1 | 0 |
| C8h | Reserved | Reserved | Reserved | Reserved | Reserved | Reserved | BPS1 | BPS0 |

| BPS1 | BPS0 | Write Protect Area | Erase Protect Area |
|---|---|---|---|
| 0 | 0 | Not Protected | Not Protected |
| 0 | 1 | Not Protected | Protected |
| 1 | 0 | Protected | Not Protected |
| 1 | 1 | Protected | Protected |

MEMORY SYSTEM STORING BLOCK PROTECTION INFORMATION

CROSS-REFERENCE TO RELATED APPLICATION

This application is based upon and claims the benefit of priority from Japanese Patent Application No. 2016-144747, filed Jul. 22, 2016, the entire contents of which are incorporated herein by reference.

FIELD

Embodiments relate to a memory system.

BACKGROUND

As a storage device, a NAND flash memory is widely known.

DESCRIPTION OF THE DRAWINGS

FIG. 2 is a cross-sectional view of the memory system according to the first embodiment.
FIG. 3 is a table showing a function of each external terminal of the memory system shown in FIG. 1.
FIGS. 15 and 16 are each a timing chart of various signals during erasing in the memory system according to the first embodiment.
FIG. 17 is a conceptual diagram showing an example of a method of storing information indicating a block to be protected in a NAND flash memory of the memory system according to the first embodiment.
FIG. 18 is a timing chart of various signals during block protection in the memory system according to the first embodiment.

DETAILED DESCRIPTION

Figure 1:
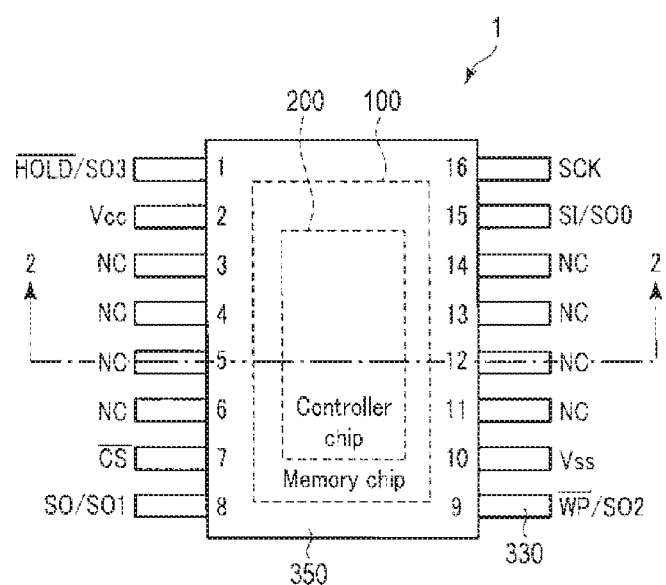
FIG. 1 is a plan view of a memory system according to an example of a first embodiment.

An embodiment provides a memory system in which a host device can determine the presence or absence of block protection.

In general, according to an embodiment, a memory system includes a controller that recognizes, as a command, a signal received immediately after a chip select signal is received from a host device, and a memory that includes a plurality of blocks. When the command is a first command, the controller outputs to the host device, information indicating whether at least one of a write operation and an erase operation with respect to at least one particular block of the plurality of blocks is prohibited.

An embodiment will be described below with reference to the accompanying drawings. In the following description, the same reference numeral is used to denote components having the same functions and configurations.

1. First Embodiment

A memory system according to a first embodiment will be described.

1.1 Configuration

1.1.1 Overall Configuration of Memory System

First, an overall configuration of a memory system according to the present embodiment will be described with reference to FIGS. 1 and 2. FIG. 1 is a plan view of a memory system according to the embodiment, and FIG. 2 is a cross-sectional view of the memory system taken along the line 2-2 in FIG. 1.

As shown, a memory system 1 includes two semiconductor chips 100 and 200. The semiconductor chip (memory chip) 100 includes a semiconductor memory such as a NAND flash memory, and the semiconductor chip 200 (controller chip) includes a controller for controlling the memory chip 100. These semiconductor chips 100 and 200 are mounted on a lead frame 300, and sealed and packaged with resin 350.

More specifically, as shown in FIG. 2, the memory chip 100 is mounted on a die pad 310 of the lead frame 300, and the controller chip 200 is stacked on the memory chip 100.

The controller chip 200 is connected to an inner lead 320 of the lead frame 300 by a bonding wire 340, for example, and further connected to the memory chip 100 by another bonding wire (not shown). Then, the memory chip 100, the controller chip 200, the die pad 310, the inner lead 320 and the bonding wire 340 are sealed with the resin 350, for example.

The inner lead 320 is connected to an outer lead 330 which is exposed to the outside of the resin 350. The outer lead 330 functions as an external connection terminal (external connection pin) of the memory system 1. In FIG. 1, 16 external connection terminals from a first pin to a sixteenth pin are included in the memory system 1. The memory system 1 communicates with the host device that controls the memory system 1 (more specifically, accesses the memory chip) via these pins.

FIG. 3 is a table showing a function of each pin. As shown, the first pin is used for the input of a control signal/HOLD or the output of serial data SO3. The control signal/HOLD is asserted ("L" level) when the communication between the host device and the memory system 1 is temporarily stopped. The second pin receives power supply voltage Vcc. The third pin to the sixth pin and the eleventh pin to the fourteenth pin are unused, and reserved for a signal or data that may be transmitted/received, for example. The seventh pin receives a chip select signal/CS. The chip select signal/CS activates the memory chip 100 and the controller chip 200 (in other words, a signal that is activated when the memory system 1 is accessed), and is asserted ("L" level) at the timing at which the host device enters a command to the memory system 1, for example. The eighth pin is used for the output of serial data (SO or SO 1). The ninth pin is used for the input of a control signal/WP or the output of serial data (SO2). The control signal/WP is a write protect signal and is asserted ("L" level) when writing to a memory chip is prohibited. The tenth pin receives a reference potential Vss. The fifteenth pin is used for the input of serial data (SI) or the output of serial data (SO0). The sixteenth pin receives a serial clock signal SCK.

The pin arrangement conforms to Serial Peripheral Interface (SPI). Then, by arbitrarily selecting the first pin, the eighth pin, the ninth pin and the fifteenth pin for serial data output, data can be output to the host device at a single speed, a double speed, or a quad speed.

Figures 4, 5:
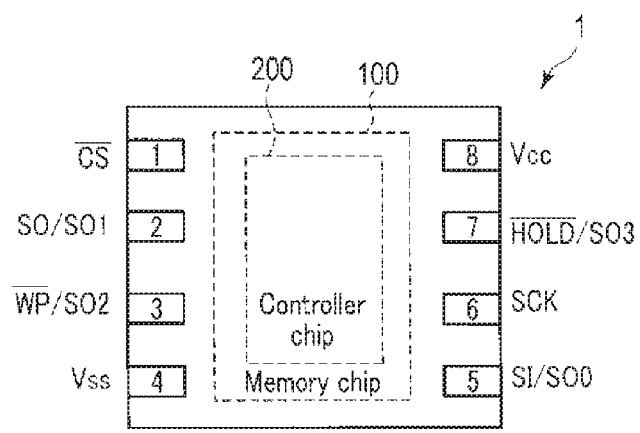
FIG. 4 is a plan view of a memory system according to another example of the first embodiment.
FIG. 5 is a table showing a function of each external terminal of the memory system shown in FIG. 4.

FIG. 4 shows an example of another package configuration of the memory system 1 different from that in FIG. 1. In FIG. 4, eight external connection terminals from the first pin to the eighth pin are provided in the memory system 1. FIG. 5 is a table showing the function of each pin of the memory system 1 shown in FIG. 4.

As shown, the first pin receives a chip select signal/CS, the second pin outputs serial data SO, SO1, the third pin receives a write protect signal/WP or outputs serial data SO2, the fourth pin receives a reference potential Vss, the fifth pin receives serial data SI, or outputs serial data SO0, the sixth pin receives a serial clock, the seventh pin receives a control signal/HOLD, or outputs serial data SO3, and the eighth pin receives power supply voltage Vcc. Also in this example, the pin configuration conforms to the SPI.

Figure 6:
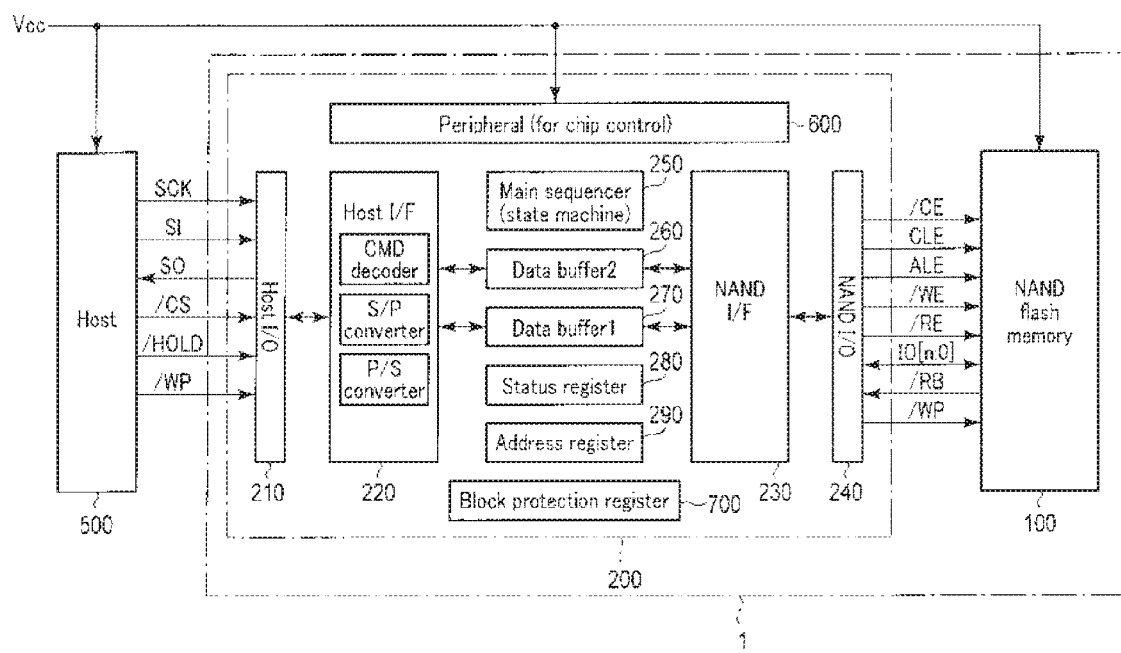
FIG. 6 is a block diagram of the memory system according to the first embodiment.

FIG. 6 is a functional block diagram of the memory system 1. Hereinafter, a memory chip 100 is referred to as a NAND flash memory 100 and a controller chip 200 is simply referred to as a controller 200.

As shown, the memory system 1 includes the NAND flash memory 100 and the controller 200.

The NAND flash memory 100 includes a plurality of memory cells, and stores data in a nonvolatile manner. The controller 200 is connected to the NAND flash memory 100 by a NAND bus, and is connected to a host device 500 by an SPI bus. The controller 200 controls access to the NAND flash memory 100.

The NAND bus transmits and receives a signal in accordance with a NAND interface. Specifically, an example of the signal includes a chip enable signal/CE, an address latch enable signal ALE, a command latch enable signal CLE, a write enable signal/WE, a read enable signal/RE, a ready/busy signal/RB, an input/output signal I/O, and a write protect signal/WP.

The signal/CE is asserted at a low level, is a signal for activating the NAND flash memory 100, and is asserted when the NAND flash memory 100 is accessed. The signals CLE and ALE are signals for notifying the NAND flash memory 100 that the input signal I/O to the NAND flash memory 100 is a command and an address, respectively. The signal/WE is asserted at a low level, and is a signal for fetching an input signal I/O in the NAND flash memory 100. The signal/RE is also asserted at a low level, and is a signal for reading an output signal I/O from the NAND flash memory 100. The ready/busy signal/RB indicates whether the NAND flash memory 100 is in a ready state (a state in which an instruction from the controller 200 can be received), or in a busy state (a state in which an instruction from the controller 200 cannot be received), the low level indicating a busy state. The input/output signal I/O is an 8-bit signal (n=8), for example. The input/output signal I/O is used for communication of data between the NAND flash memory 100 and the controller 200, such as a command, an address, write data and read data (user data). The signal/WP is a signal for prohibiting writing to the NAND flash memory 100.

The SPI bus is described in FIG. 3 and FIG. 5.

1.1.2 Configuration of Controller 200

Next, details of the configuration of the controller 200 will be described with reference to FIG. 6. As shown, the controller 200 includes a host input/output circuit 210, a host interface circuit 220, a NAND interface circuit 230, a NAND input/output circuit 240, a sequencer (state machine) 250, data buffers 260 and 270, a status register 280, an address register 290, a block protection register 700, and a peripheral circuit 600.

The host input/output circuit 210 functions as a buffer for signals communicated with the host device 500. Signals SCK, SI, /CS, /HOLD, and /WP are first received by the host input/output circuit 210, and then, output to the host interface circuit 220.

The host interface circuit 220 fetches a signal SI therein in synchronism with the signal SCK. Further, the host interface circuit 220 transmits a signal SO that is output in synchronization with the signal SCK to the host device 500 through the host input/output circuit 210.

The host interface circuit 220 is responsible for the control of communication of a signal with the host device 500 through the host input/output circuit 210. Further, the host interface circuit 220 functions as a serial/parallel converter and a parallel/serial converter. For example, the host interface circuit 220 converts an input signal SI from the host device 500 from a serial signal into a parallel signal, and converts data read from the NAND flash memory 100 from a parallel signal into a serial signal. Further, the host interface circuit 220 functions as a command decoder when the input signal SI is a command, and decodes the received command. Then, the host interface circuit 220 outputs a decoding result to the sequencer 250, for example.

The data buffers 260 and 270 temporarily store the write data received from the host device 500 through the host interface circuit 220. Furthermore, the data buffers 260 and 270 temporarily store the data read from the NAND flash memory 100 through the NAND interface circuit 230.

The status register 280 stores various status information for the memory system 1. For example, the status register 280 holds a feature table.

The address register 290 holds an address received from the host device 500 through the host interface circuit 220.

The NAND interface circuit 230 is responsible for the control of communication of a signal with the NAND flash memory 100 through the NAND input/output circuit 240. Then, in accordance with an instruction from the sequencer 250, the NAND interface circuit 230 issues various command conforming to the NAND interface, and outputs the command to the NAND flash memory 100 through the NAND input/output circuit 240 together with the address in the address register 290. During data writing, the NAND interface circuit 230 outputs data in the data buffer 260 and/or 270 to the NAND flash memory 100 through the NAND input/output circuit 240. Further, during data reading, the NAND interface circuit 230 transfers data read from the NAND flash memory 100 to the data buffer 260 and/or 270.

The NAND input/output circuit 240 functions as a buffer for signals communicated with the NAND flash memory 100. In addition, in accordance with the instruction of the NAND interface circuit 230, the NAND input/output circuit 240 asserts or de-asserts the signals /CE, CLE, ALE, /WE, /RE, /WP. Further, during data reading, the NAND input/output circuit 240 temporarily holds the signal IC (read data) and transfers the signal IC (read data) to the NAND interface circuit 230, and, during data writing, temporarily holds the signal IC (write data) and transmits the signal IC (write data) to the NAND flash memory 100. Moreover, the NAND input/output circuit 240 receives the ready/busy signal/RB from the NAND flash memory 100, and transfers the ready/busy signal/RB to the NAND interface circuit 230.

The sequencer 250 controls entire operations of the controller 200. For example, when a data reading request is received from the host device 500, the sequencer 250 instructs the NAND interface circuit 230 to execute a sequence for performing a read operation. Further, when a data writing request is received from the host device 500, the sequencer 250 instructs the NAND interface circuit 230 to execute a sequence for performing a write operation. Further, according to the status information received from the NAND flash memory 100, the sequencer 250 updates the feature table in the status register 280.

The block protection register 700 stores block protection information. For example, when a block protection request is received from the host device 500, the block protection register 700 writes flag information into an entry indicating a block to be protected. Flag information is set as "1" when the block is to be protected, and set as "0" when the block is not to be protected.

The peripheral circuit 600 receives power supply voltage Vcc from the outside, and transfers the power supply voltage Vcc to each circuit block, and performs other control necessary for the operation of the controller 200.

1.1.3 Configuration of NAND Flash Memory 100

Figure 7:
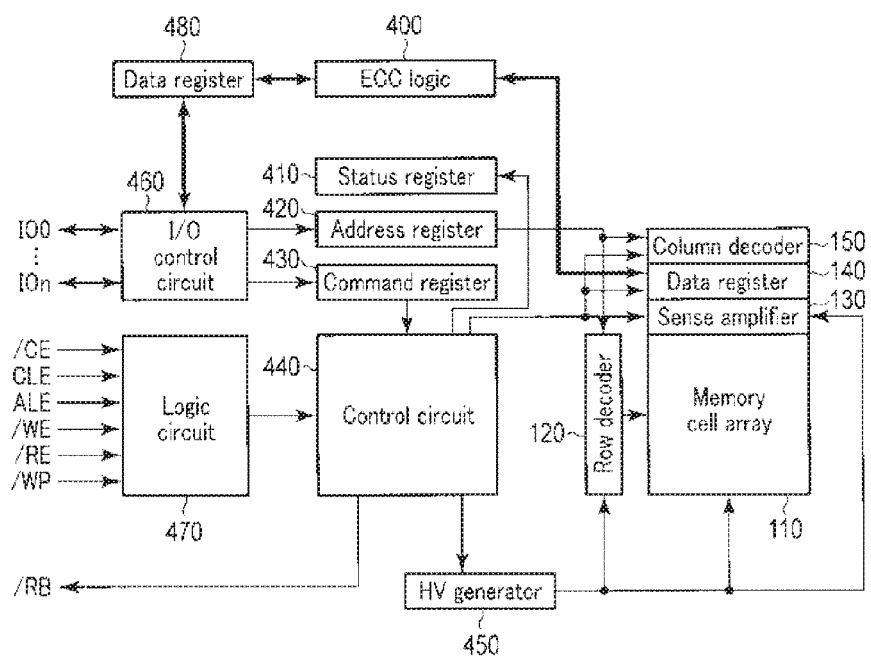
FIG. 7 is a block diagram of a semiconductor memory device according to the first embodiment.

Next, the configuration of the NAND flash memory 100 will be described with reference to FIG. 7. FIG. 7 is a block diagram of the NAND flash memory 100.

As shown, the NAND flash memory 100 includes a memory cell array 110, a row decoder 120, a sense amplifier 130, a data register 140, a column decoder 150, an ECC circuit 400, a status register 410, an address register 420, a command register 430, a control circuit 440, a voltage generation circuit 450, an input/output control circuit 460, a logic circuit 470 and a data register 480.

The memory cell array 110 includes a plurality of non-volatile memory cells arranged in rows and columns. Memory cells in the same row are connected to the same word line, and memory cells in the same column are connected to the same bit line. Reading and writing of data are performed collectively for a plurality of memory cells connected to the same word line. This unit is called a page. Data of one page includes the content of data and management data. The content of data is managed in a unit called a sector. For example, in this example, one page includes four sectors, each sector having the data size of 512 bytes. The management data includes, for example, ECC data (parity) for error correction. Error correction is performed for each sector. Therefore, the management data include ECC data for each sector. Further, data is collectively erased in units of a plurality of pages. This unit is called a block.

The row decoder 120 decodes a row address that specifies the row direction of the memory cell array 110. Then, the row decoder 120 selects a word line according to the decoding result, and applies voltage necessary for writing, reading, and erasing of data.

During data reading, the sense amplifier 130 senses data read from the memory cell array 110, and transfers the data to the data register 140. During data writing, the sense amplifier 130 transfers data in the data register 140 to the memory cell array 110.

The data register 140 temporarily holds write data or read data of one page.

The column decoder 150 decodes a column address that specifies the column direction of the memory cell array 110. Then, according to the decoding result, the column decoder 150 transfers data to the data register during data writing, and reads data from the data register during data reading.

The ECC circuit 400 performs error detection and error correction processing. More specifically, during data writing, the ECC circuit 400 generates a parity for each sector based on the data received from the controller 200, and transfers the parity and the content of data to the data register 140. During data reading, the ECC circuit 400 generates syndrome for each sector based on the parity included in the data transferred from the data register 140 to detect an error. Then, when an error is detected, the bit position is identified to correct the error. The number of correctable error bits per sector is, in this example, eight bits per sector, for example. Further, the ECC circuit 400 may output the number of error bits detected in each sector to the status register 410 as status information.

The logic circuit 470 receives the signals/CE, CLE, ALE, /WE, /RE and /WP from the controller 200.

The input/output control circuit 460 receives the signal IO[n:0]. When the signal IC is an address (ALE="H"), the input/output control circuit 460 causes the address register 420 to hold the address (ALE="H"). Further, when the signal IC is a command (CLE="H"), the input/output control circuit 460 causes the command register 430 to hold the command (CLE="H"). Further, when the signal IC is data (ALE=CLE="L"), the input/output control circuit 460 causes the data register 480 to hold the data (ALE=CLE="L").

The status register 410 holds various kinds of status information for the NAND flash memory 100. The status information includes the number of error bits provided by the ECC circuit 400 described above, information indicating whether a write operation and an erase operation performed by the control circuit 440 was successful (pass) or failed (fail), and the like.

The control circuit 470 controls the entire NAND flash memory 100 based on a command held in the command register 430 and various signals input into the logic circuit 470. In addition, the control circuit 470 generates the ready/busy signal/RB, and outputs the signal to the controller 200.

Based on an instruction of the control circuit 470, the voltage generation circuit 450 generates voltage necessary for the write, read, and erase operations, and supplies the voltage to the memory cell array 110, the row decoder 120, and the sense amplifier 130.

1.2 Operation

Next, the read operation, write operation, and erase operation carried out by the memory system 1 according to the embodiment will be described below, focusing on signals communicated through the SPI bus and the NAND bus.

1.2.1 Read Operation

First, a read operation will be described. The read operation generally includes the following three steps:

(1) Reading of data from the NAND flash memory: through this operation, data are read from the NAND flash memory 100 to the controller 200.
(2) Reading of a feature table (sometimes referred to as Get feature): through this operation, whether the memory system 1 is in a ready state or in a busy state, that is, whether the operation (1) is completed is determined.
(3) Reading of data from the controller 200: through this operation, data read by the controller 200 in (1) are transmitted to the host device 500.

Figure 8:
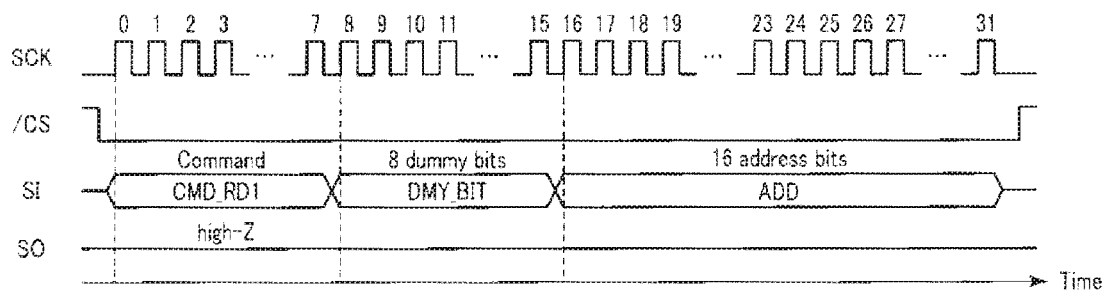
FIG. 8 is a timing chart of various signals during reading in the memory system according to the first embodiment.

FIG. 8 is a time chart of various signals on the SPI bus during the operation (1) described above. As shown, the host device 500 asserts the signal/CS, issues a first read command CMD_RD1 as the signal SI, and further inputs the clock SCK.

The host interface circuit 220 of the controller 200 recognizes the signal SI when the signal/CS is asserted and the first clock SCK is received as a command. This command is, for example, an 8-bit signal that is input for eight clock cycles. By receiving the first read command CMD_RD1, the sequencer 250 initiates a data read sequence.

Subsequently, the host device 500 transmits a dummy bit DMY_BIT to the controller 200 for eight clock cycles, for example, and transmits an address ADD to the controller 200 for 16 cycles, for example. Then, after the transmission of the address ADD, the host device 500 de-asserts the signal/CS. The address ADD is an address for specifying a block and a page in the NAND flash memory 100, and is held in the address register 290.

Here, when a specific command is received, a subsequently input signal (command sequence) is predetermined. That is, the controller 200 recognizes that, for example, when a first read instruction is received, a signal SI that is to be input for the subsequent eight clock cycles is meaningless dummy data, and a signal SI that is to be input in the subsequent 16 clock cycles is a substantive address signal.

Figure 9:
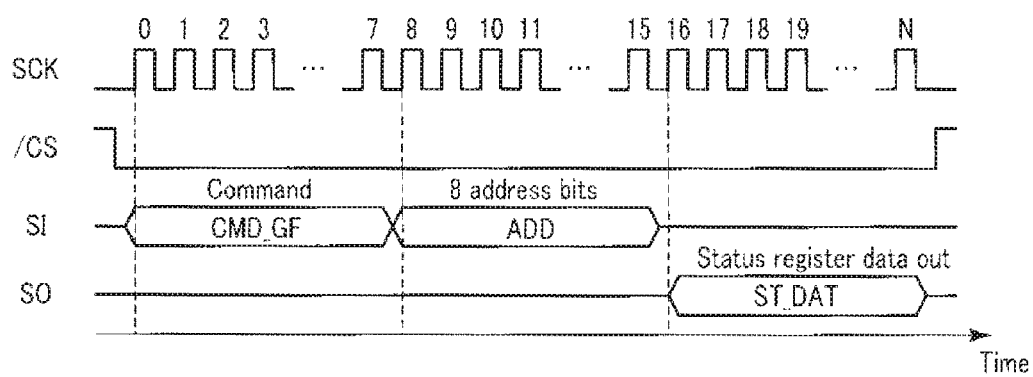
FIGS. 9-11 are each a timing chart of various signals during reading in the memory system according to the first embodiment.

The operation (2) is performed subsequently to the operation (1). FIG. 9 is a time chart of various signals on the SPI bus during the operation (2). As shown, the host device 500 asserts the signal/CS again, issues a Get feature command CMD_GF as the signal SI, and further issues the clock SCK.

Subsequently, the host device 500 transmits an address ADD to the controller 200 for eight clock cycles, for example. The address ADD is an address in the feature table, and is an address for specifying a region where ready/busy information is stored. In the controller 200, after the address ADD is received, the host interface circuit 220 reads a specified entry in the feature table from the status register 280, for example, in accordance with the instruction of the sequencer 250, and transmits the entry to the host device 500 as 8-bit status data ST_DAT for eight cycles. The status data ST_DAT includes ready/busy information. Then, after the status data ST_DAT is received, the host device 500 de-asserts the signal/CS.

Figure 10:
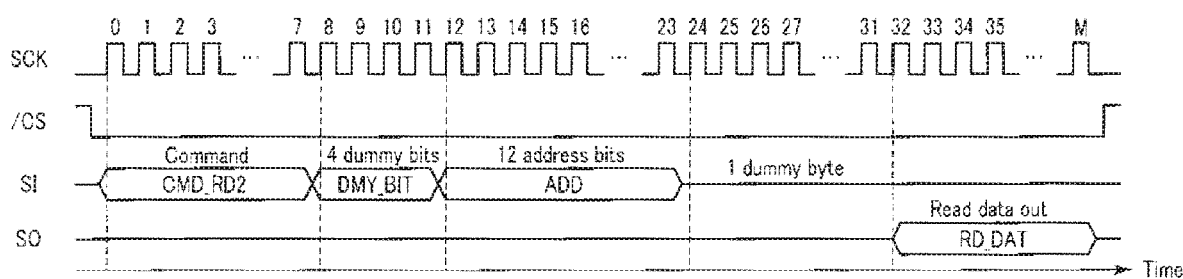

When the received status data ST_DAT indicates that the memory system 1 is in a ready state, the operation (3) is performed. FIG. 10 is a time chart of various signals on the SPI bus during the operation (3). As shown, the host device 500 asserts the signal/CS, issues a second read command CMD_RD2 as the signal SI, and further issues the clock SCK.

Subsequently, the host device 500 transmits a dummy bit DMY_BIT to the controller 200 for four clock cycles, for example, and transmits an address ADD to the controller 200 for 12 cycles, for example. The address ADD is an address for specifying a region in the data buffer 260 or 270 of the controller 200, and is an address for specifying a column in the page of the NAND flash memory 100. The address ADD is held in the address register 290. Then, for example, in accordance with the control of the sequencer 250, the host interface circuit 220 reads data from the data buffer 260 or 270. Then, after the elapse of eight clock cycles, the host interface circuit 220 transmits the data RD_DAT read from the data buffer 260 or 270 to the host device 500.

Figure 11:
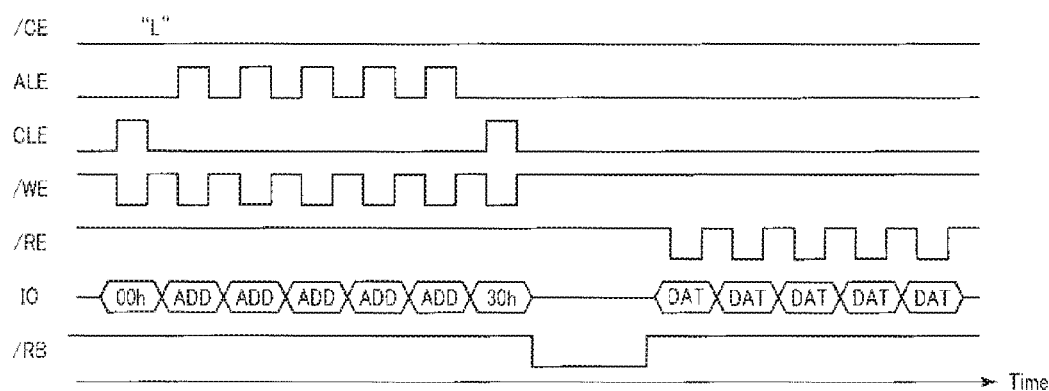

FIG. 11 is a time chart of various signals on the NAND bus during the operation (1). When the controller 200 receives the first read command CMD_RD1, for example, according to the control of the sequencer 230, the NAND interface circuit 230 issues an address input command "00h", and transmits the command to the NAND flash memory 100. Subsequently, for example, for five cycles, addresses ADD are transmitted to the NAND flash memory 100, and a read command "30h" is issued, which is transmitted to the NAND flash memory 100. Here, the address ADD includes an address indicating a block, page, and column held in the address register 290 through the operation shown in FIGS. 8 and 10.

In response to the command "30h", a read operation of data from the memory cell array 110 is started in the NAND flash memory 100, and the NAND flash memory 100 becomes a busy state (/RB="L").

When reading of the data from the memory cell array 110 is completed, the NAND flash memory 100 becomes a ready state. In response, the controller 200 toggles the signal/RE.

Then, in synchronism with the signal/RE, the data are transferred from the NAND flash memory 100 to the controller 200.

1.2.2 Write Operation

Next, a write operation will be described. The write operation generally includes the following three steps:
(1) Data transfer from the host device 500 to the controller 200.
(2) Writing of the transferred data into the NAND flash memory 100.
(3) Reading of a feature table (Get feature): through this operation, whether writing into the NAND flash memory 100 has passed or failed is determined.

Figure 12:
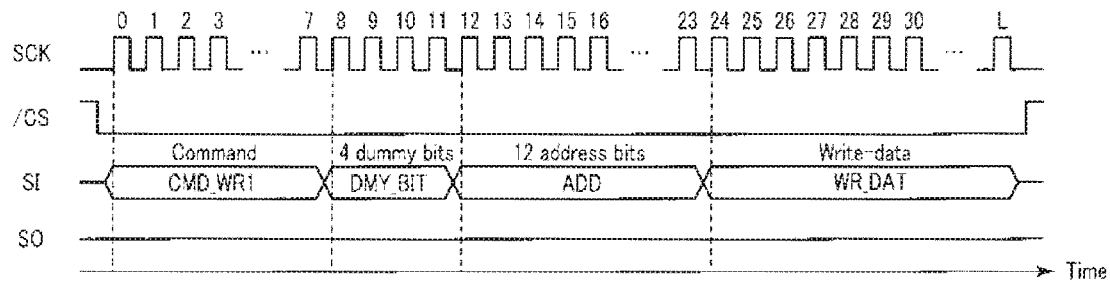
FIGS. 12-14 are each a timing chart of various signals during writing in the memory system according to the first embodiment.

FIG. 12 is a time chart of various signals on the SPI bus during the operation (1). As shown, the host device 500 asserts the signal/CS, issues a first write command CMD_WR1 as the signal SI, and further issues the clock SCK. By receiving the first write command CMD_WR1, the sequencer 250 initiates a data write sequence.

Subsequently, the host device 500 transmits a dummy bit DMY_BIT to the controller 200 for four clock cycles, for example, and transmits an address ADD to the controller 200 for 12 cycles, for example. The address ADD species a region in the data buffer 260 or 270, and specifies a column in the page of the NAND flash memory 100. The address ADD is held in the address register 290. In addition, the host device 500 transmits the write data WR_DAT to the controller 200. The write data WR_DAT is held in the data buffer 260 or 270 in a region corresponding to the ADD received immediately before. Then, after the data WR_DAT are transmitted, the host device 500 de-asserts the signal/CS.

Figure 13:
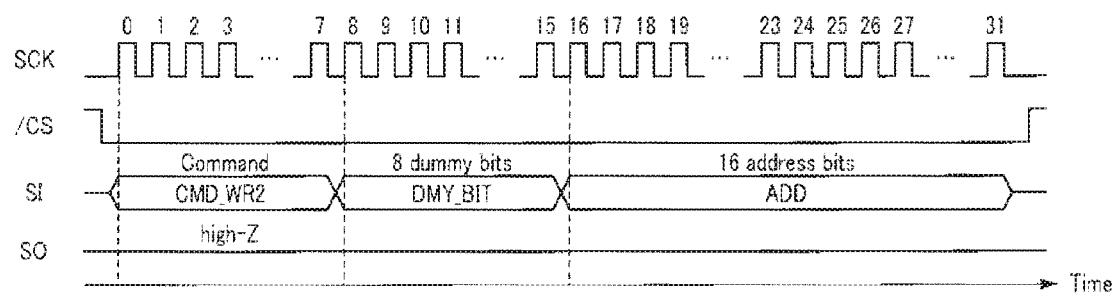

The operation (2) is performed subsequently to the operation (1). FIG. 13 is a time chart of various signals on the SPI bus during the operation (2). As shown, the host device 500 asserts the signal/CS again, issues a second write command CMD_WR2 as the signal SI, and further issues the clock SCK. When the second write command CMD_WR2 is received, the sequencer 250 recognizes the reception of the operation instruction of the operation (2).

Subsequently, the host device 500 transmits an 8-bit dummy bit DMY_BIT to the controller 200 for eight clock cycles, for example, and transmits a 16-bit address ADD to the controller 200 for 16 cycles, for example. The address ADD specifies a block and a page in the NAND flash memory 100, and is held in the address register 290. Then, after the transmission of the address ADD, the host device 500 de-asserts the signal/CS.

The operation (3) is performed subsequently to the operation (2). The command sequence in the operation (3) is the same as in FIG. 9 described about the read operation. Further, when the received status data ST_DAT indicates that the memory system 1 is in a ready state, the host device 500 then requests information on whether the writing of data has failed or not.

Figure 14:
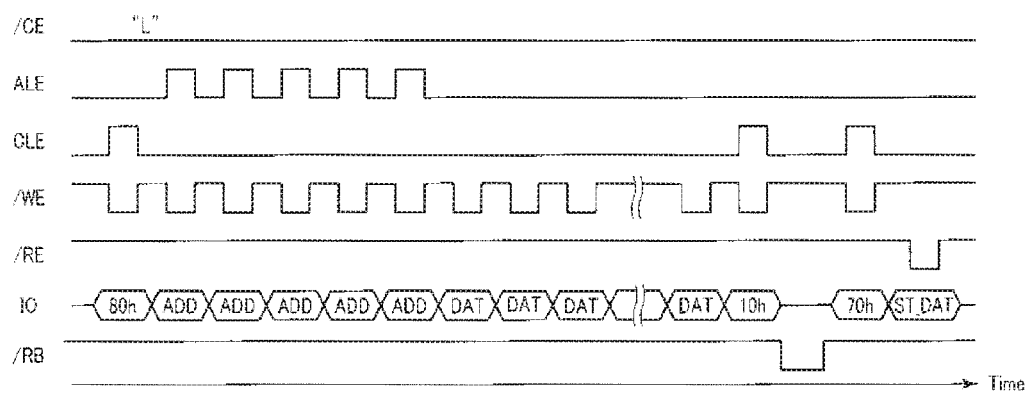

FIG. 14 is a time chart of various signals on the NAND bus during the operation (2) described above. When the controller 200 that receives the second write command CMD_WR2, for example, according to the control of the sequencer 250, the NAND interface circuit 230 issues a write command "80h", and transmits the command to the NAND flash memory 100. Subsequently, for example, for five cycles, addresses ADD are transmitted to the NAND flash memory 100, and write data DAT are then transmitted to the NAND flash memory 100 for several cycles. Thereafter, a write command "10h" is issued, which is transmitted to the NAND flash memory 100. Here, the address ADD includes an address indicating a block, page, and column held in the address register 290 through the operation shown in FIGS. 12 and 13.

In response to the command "10h", a write operation of data into the memory cell array 110 is started in the NAND flash memory 100, and the NAND flash memory 100 becomes a busy state (/RB="L").

When writing of the data into the memory cell array 110 is completed, the NAND flash memory 100 becomes a ready state. In response, the controller 200 issues a status read command "70h" to toggle the signal/RE. Then, in synchronism with the signal/RE, the status data ST_DAT indicating whether the write operation has passed or failed is transferred to the controller 200. The status data ST_DAT is held in the feature table, and read out to the host device 500 by the Get feature command during the operation (3).

1.2.3 Erase Operation

Next, an erase operation will be described. The erase operation generally includes the following two steps:
(1) Erase instruction from the host device 500 to the controller 200.
(2) Reading of a feature table (Get feature): through this operation, whether the erase operation of the NAND flash memory 100 has passed or failed is determined.

Figure 15:
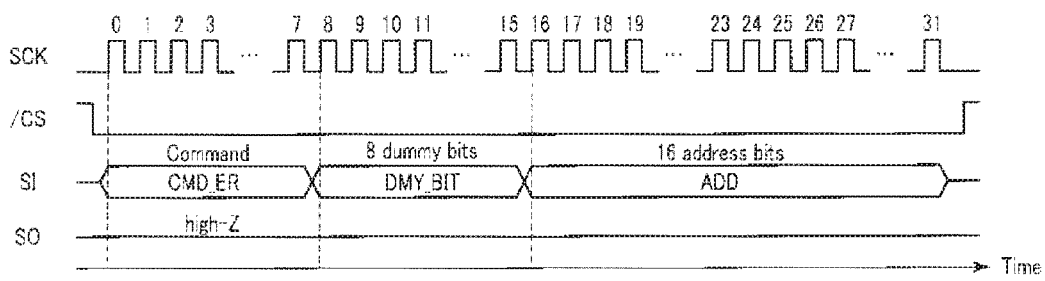

FIG. 15 is a time chart of various signals on the SPI bus during the operation (1). As shown, the host device 500 asserts the signal/CS, issues an erase command CMD_ER as the signal SI, and further issues the clock SCK. By receiving the erase command CMD_ER, the sequencer 250 initiates a data erase sequence.

Subsequently, the host device 500 transmits an 8-bit dummy bit DMY_BIT to the controller 200 for eight clock cycles, for example, and transmits a 16-bit address ADD to the controller 200 for 16 cycles, for example. The address ADD is an address for specifying a block to be erased in the memory cell array 110 and is held in the address register 290. Then, the host device 500 de-asserts the signal/CS.

The operation (2) is performed subsequently to the operation (1). The command sequence in the operation (2) is the same as in FIG. 9 described about the read operation. Further, when the received status data ST_DAT indicates that the memory system 1 is in a ready state, the host device 500 then requests information on whether the erasing of data has passed or failed.

FIG. 16 is a time chart of various signals on the NAND bus during the operation (1). When the controller 200 that receives the erase command CMD_ER, for example, according to the control of the sequencer 250, the NAND interface circuit 230 issues an erase command "60h", and transmits the command to the NAND flash memory 100. Subsequently, for example, for 3 cycles, addresses ADD are transmitted to the NAND flash memory 100, and an erase command "D0h" is issued, which is transmitted to the NAND flash memory 100.

In response to the command "D0h", an erase operation of data in the memory cell array 110 is started in the NAND flash memory 100, and the NAND flash memory 100 becomes a busy state (/RB="L").

When erasing of the data is completed, the NAND flash memory 100 becomes a ready state. In response, the controller 200 issues a status read command "70h" to toggle the signal/RE. Then, in synchronism with the signal/RE, the status data ST_DAT indicating whether the erase operation has passed or failed is transferred to the controller 200. The status data ST_DAT is held in the feature table, and read out to the host device 500 by the Get feature command during the operation (2).

1.3 Block Protection

Next, the block protection according to the embodiment will be described.

1.3.1 Function of Block Protection

The memory system 1 according to the present embodiment has a control function to protect a user block when a specific command that requests protection of the block in the NAND flash memory 100 is received from the host device 500. The specific command is referred to as a block protection command. In addition, the protection in this case means to prohibit erasing or writing of data stored in a user block specified to be protected by the host device 500. The control function is achieved by, for example, the sequencer 250 and the block protection register 700 in the controller 200. In this case, the sequencer 250 performs processing for protecting a block when a command that is recognized by the host interface circuit 220 is a block protection command.

The block protection command requests to prohibit the erasing or writing of data with respect to a user block in the NAND flash memory 100. An address included in the command sequence indicates a block to be protected. After processing for protecting a block is performed, the sequencer 250 prohibits erasing or writing of data with respect to a block to be protected when there is an erase command or a write command with respect to the block to be protected.

1.3.2 Storage of Information that Indicates Block to be Protected

A storage area (block protection register 700) for storing information that indicates a block to be protected in the NAND flash memory 100 is provided in the controller 200. The storage area cannot be accessed from the host device 500, for example. Information that indicates the block to be protected is stored, for example, in the block protection register 700, as shown in FIG. 17. In this case, as the information that indicates whether the block should be protected, a flag is written in an entry corresponding to the address of the block to be protected. For example, "1" is stored for an entry corresponding to a block to be protected, and, for example, "0" is stored for an entry corresponding to a block not to be protected.

1.3.3 Type of Block Protection Command

In the present embodiment, as a block protection command, a Protect Execute command "11h" is used.

A Protect execute command is a command by which only some user blocks predetermined by the controller 200 can be protected by the host device 500, but other user blocks cannot be protected.

When there is a Protect execute command, the sequencer 250 determines whether a block requested to be protected by the Protect execute command corresponds to a protectable user block, and, if not, stops the processing that is requested by the Protect execute command without execution.

The sequencer 250 can set and change a user block to be protected with respect to the Protect execute command. The setting information is stored in a predetermined region of the controller 200, and is also stored in a predetermined region of the feature table stored in the status register 280.

Further, the host device 500 that can use the Protect execute command may be preset by the sequencer 250.

The present embodiment shows an example of a memory system that can process the Protect execute command as a block protection command that can be processed.

1.3.4 Block Protection Operation

Next, the block protection operation will be described. The block protection operation generally includes the following two steps:
(1) Block protection operation by the controller 200
(2) Reading of a feature table (Get feature): through this operation, whether a block protection operation has passed or failed is determined.

FIG. 18 is a time chart of various signals on the SPI signal during the operation (1). As shown, the host device 500 asserts the signal/CS, issues a block protection command CMD_BP ("11h") as the signal SI, and further issues the clock SCK. By receiving the block protection command CMD_BP, the sequencer 250 initiates a block protection sequence.

Subsequently, the host device 500 transmits an 8-bit dummy bit DMY_BIT to the controller 200 for eight clock cycles, for example, and transmits a 16-bit address ADD to the controller 200 for 16 cycles, for example. The address ADD specifies a block to be protected in the memory cell array 110, and is held in the address register 290. Then, the host device 500 de-asserts the signal/CS.

In the controller 200 that receives the block protection command CMD_BP, for example, according to the control of the sequencer 250, a flag that indicates a block protection is written into a target entry of the block protection register 700 of the controller 200.

When a block protection operation is completed in the controller 200, the memory system 100 becomes a ready state. The host device 500 can find out that the memory system 100 becomes a ready state through the Get feature command.

1.3.5 Flow of Block Protection Operation

Figure 19:
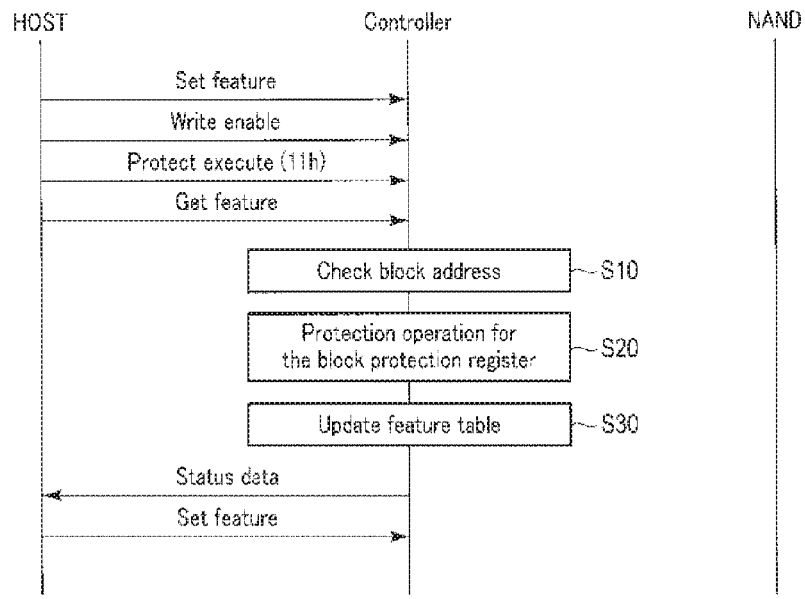
FIG. 19 is a flowchart showing a block protection operation in the memory system according to the first embodiment.
Figure 20:
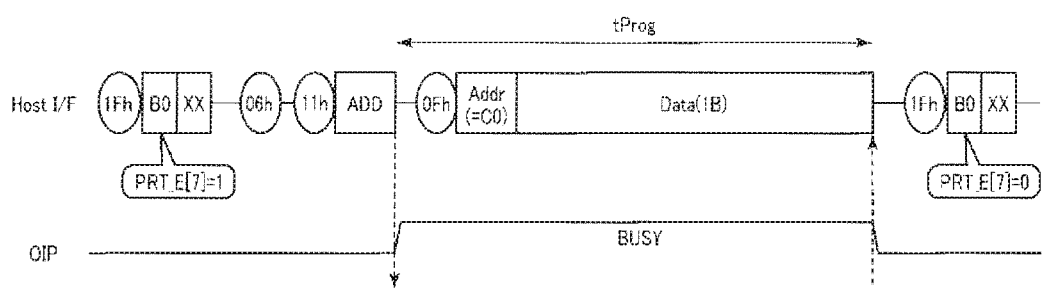
FIG. 20 is a command sequence during the block protection operation in the memory system according to the first embodiment.

Next, the details of the flow of the block protection operation will be described with reference to FIGS. 19 and 20. FIG. 19 is a flow chart showing the operation of the host device 500, the controller 200, and the NAND flash memory 100 during the block protection operation, and FIG. 20 is a command sequence.

Note that it is assumed that data have been already written into a block of the NAND flash memory 100 that is to be protected, through the write operation described above.

As shown, before issuing the Protect execute command "11h" that is a block protection command, the host device 500 issues a feature table set command (Set feature command) "1Fh" as well as issuing a write enable command "06h".

Specifically, the host device 500 issues the Set feature command "1Fh", and subsequently, issues information that indicates setting of either of block protection command enabled/disabled (hereinafter, referred to as "B0 setting information"). B0 setting information includes an address "B0" in the feature table in the status register 280, for example, and a value "1" or "0" that indicates either state of the block protection command enabled/disabled as information to be held in the entry corresponding to the address "B0".

Here, in order to enable the block protection command, the host device 500 issues "PRT_E [7]=1" as B0 setting information, for example. Then, the sequencer 250 reflects the value "1" indicating that the block protection command is enabled with respect to a specified entry in the feature table. Subsequently, the host device 500 issues a Write enable command "06h". Then, the sequencer 250 reflects the value "1" indicating that the writing of data is enabled with respect to a specified entry in the feature table. As a result, the host device 500 enters into a state in which the block protection command can be used.

Then, the host device 500 issues a Protect execute command "11h" as a block protection command, and then, issues an address ADD. In response to this address, the memory system 1 becomes a busy state, OIP (Operation in Progress) in the feature table becomes "1". Here, OIP is a flag indicating whether the memory system 1 is in a ready state or in a busy state, "0" indicating a ready state and "1" indicating a busy state. Further, the host device 500 issues a Get feature command "0Fh" and an address "C0", and reads the information (1 byte data) for the entry including the OIP from the feature table. As long as the clock SCK is input, the entry information is transmitted to the host device 500 repeatedly until the OIP becomes "0" (Get feature command may be issued repeatedly).

The memory system 1 becomes a busy state, and the controller 200 determines whether the block protection command received from the host device 500 is correct (step S10), and if so, the flag information is written into the target entry of the block protection register 700 (step S20).

Then, the block protection setting is completed in the controller 200, the memory system 1 enters into a ready state, and, for example, the sequencer 250 sets the OIP in the feature table from "1" to "0".

Further, the controller 200 stores in the feature table, status data ST_DAT indicating whether the execution of the block protection has passed or failed (step S30), and outputs the data when receiving the Get Feature command from the host device 500.

On the other hand, in step S10 described above, when the block protection command received from the host device 500 is not correct, the controller 200 stores in the feature table, the status data ST_DAT indicating that the block protection operation has failed, for example, without writing the flag into the block protection register 700 (step S30). Then, the memory system 1 enters into a ready state, and, for example, the sequencer 250 sets the OIP in the feature table from "1" to "0". When the Get Feature command is received from the host device 500, the information may be output.

Finally, the host device 500 issues a Set feature command "1Fh", and issues "PRT_E [7]=0" as B0 setting information, for example, in order to disable the block protection command. Then, the sequencer 250 reflects the value "0" indicating that the block protection command is disabled with respect to a specified entry in the feature table.

Thus, a series of operation for block protection is completed.

Figure 21:
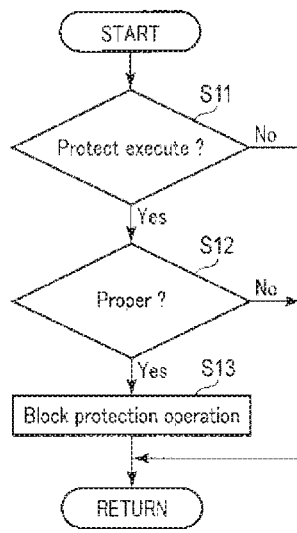
FIG. 21 is a flowchart showing command identification processing carried out during the block protection operation in the memory system according to the first embodiment.

Next, a command identification process performed in the processing of step S10 in the flowchart in FIG. 19 will be described with reference to FIG. 21.

When the controller 200 recognizes that the block protection command received from the host device 500 is a Protect execute command "11h" (YES in step S11), the controller 200 determines whether a user block specified by the host device 500 is a predetermined protectable block (step S12). More specifically, it is determined whether an address included in the command sequence of the Protect execute command corresponds to an address of a predetermined protectable block in a predetermined region in the feature table. If the address corresponds to a protectable block (Yes in step S12), it is determined that the command is correct, the block protection with respect to the user block specified by the host device 500 is permitted (step S13), and the execution of the block protection is instructed to the block protection register 700. In other words, the flag information is written into a target entry of the block protection register 700.

On the other hand, if the user block specified by the host device 500 does not correspond to a predetermined protectable block in step S12 (No in step S12), the controller 200 determines that the command is not correct, and the block protection processing is not performed with respect to the user block specified by the host device 500. In other words, the instruction of the block protection is not stored in the block protection register 700. In this case, for example, the status data that indicates that the block protection operation has failed or the status data that the command is not correct may be stored in the feature table and notified to the host device 500.

1.3.6 Flow of Operation after Completion of Block Protection Operation

Figure 22:
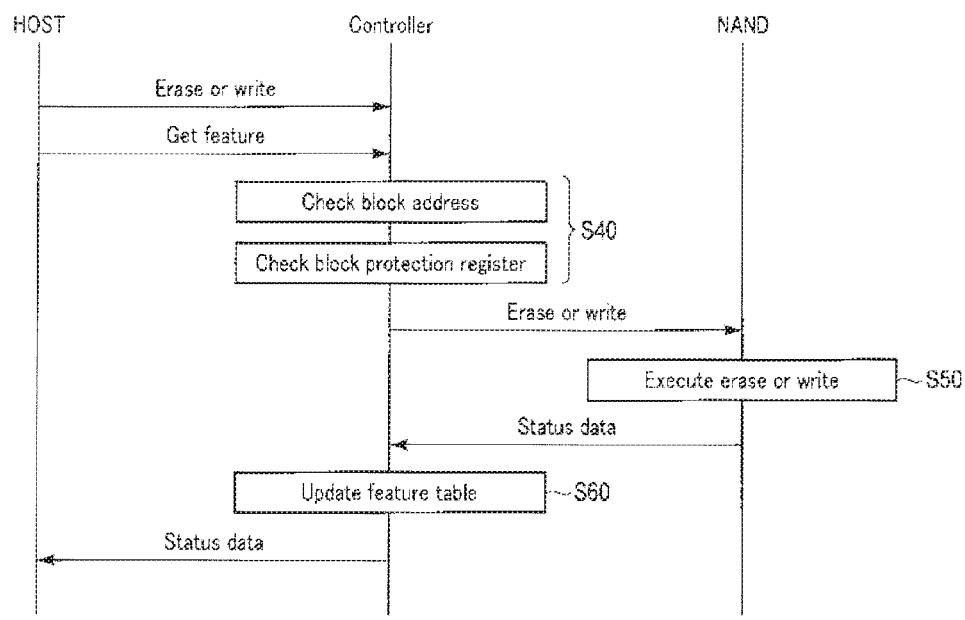
FIG. 22 is a flowchart showing an operation carried out after completion of the block protection operation in the memory system according to the first embodiment.

Next, the operation after completion of the block protection operation will be described with reference to FIG. 22. FIG. 22 is a flow chart showing the operation of the host device 500, the controller 200, and the NAND flash memory 100 after completion of the block protection operation.

As shown, the host device 500 issues, for example, an erase command or a write command. In response, the memory system 1 enters into a busy state. Further, the host device 500 issues a Get feature command.

The memory system 1 enters into a busy state, and the controller 200 determines whether a command received from the host device 500 is an erase command or a write command with respect to a block that is set to be protected in the block protection register 700 (step S40). If the command is not an erase command or a write command with respect to a block that is set to be protected, the acceptance of the command received from the host device 500 is permitted, and a corresponding command is issued to the NAND flash memory 100. Thus, the NAND flash memory 100 enters into a busy state. Then, erasing or writing of data in the memory cell array 110 is performed (step S50).

Then, erasing or writing of the data in the memory cell array 110 is completed, and the NAND flash memory 100 enters into a ready state. In response, when the controller 200 issues a status read command, the status data that indicates whether an erase operation or a write operation has passed or failed is transferred to the controller 200 from the NAND flash memory 100. The controller 200 stores the status data in the feature table (step S60), and further notifies the host device 500 of the data.

On the other hand, in step S40 described above, when the command received from the host device 500 is an erase command or a write command with respect to the block that is set to be protected, the controller 200 stores in the feature table, the status data indicating that the erase command or the write command has failed, for example, without issuing the erase command or the write command to the NAND flash memory 100 (step S60), and further notifies the host device 500 of the data.

1.3.7 Confirmation of Presence or Absence of Block Protection

Figure 23:
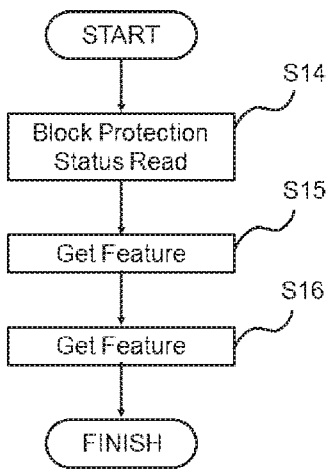
FIG. 23 is a flowchart showing an operation of determining the presence or absence of block protection in the memory system according to the first embodiment.

Next, the operation of the host device 500 and the controller 200 when the host device 500 determines whether a block is protected will be described with reference to FIG. 23. FIG. 23 is a flowchart showing the operation of the host device 500 at the time of determining the presence or absence of block protection.

First, the host device 500 issues a Block Protection Status Read command to the controller 200 (step S14). The Block Protection Status Read command specifies a block for which the presence or absence of the protection should be determined.

For example, according to the control of the sequencer 250, the controller 200 that receives the Block Protection Status Read command refers to a target entry of the block protection register 700 to determine whether or not the block specified by the Block Protection Status Read command is protected. For example, the controller 200 stores the presence or absence of protection confirmed in a region specified by the address "C8h" in the feature table.

Next, in order to confirm the completion of processing of the Block Protection Status Read command transmitted in step S14, the host device 500 issues the Get Feature command to the controller 200 (step S15). In response to the Get Feature command, the controller 200 outputs the status data ST_DAT including ready/busy information to the host device 500. The controller 200 notifies the host device 500 that the memory system 1 is in a busy state until the presence or absence of the protection confirmed is reflected in the feature table. In addition, the controller 200 notifies that the memory system 1 is in a ready state after the presence or absence of the protection is reflected in the feature table. The host device 500 determines whether the processing of the Block Protection Status Read command is completed based on the ready/busy information in the status data ST_DAT.

Next, after the processing of the Block Protection Status Read command is completed, the host device 500 issues the Get Feature command to the controller 200 with the address "C8h" in the feature table specified (step S16). According to the Get Feature command, the controller 200 notifies the host device 500 of information on the presence or absence of protection stored in the feature table in step S14.

Figures 24, 25, 26, 27, 28:
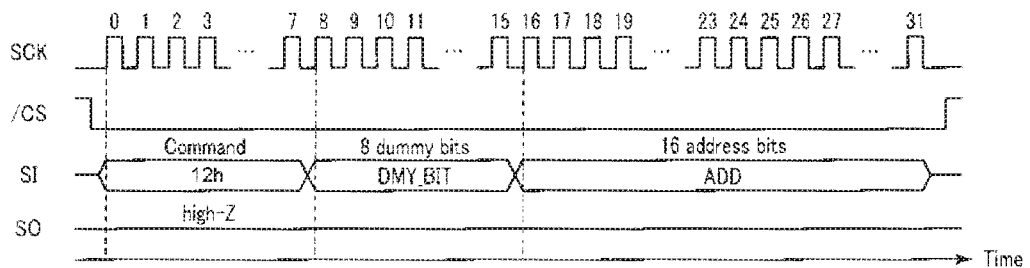
FIG. 24 shows an example of a configuration of a feature table in the memory system according to the first embodiment.
FIG. 25 shows definitions of status bits stored in the feature table in FIG. 24.
FIG. 26 is a command sequence at the time of determining the presence or absence of block protection in the memory system according to the first embodiment.
FIG. 27 shows a variation of a configuration of a feature table in the memory system according to the first embodiment.
FIG. 28 shows the definition of status bits stored in the feature table in FIG. 27.

FIG. 24 shows the configuration of the feature table in which information on the presence or absence of protection is stored. FIG. 24 shows only a region where the address "C8h" is assigned in the features table. BPS0, which is a Block Protection Status bit, is stored in 0th bit. FIG. 25 shows the definition of the BPS0. The BPS0 representing "0" indicates that the block specified by the Block Protection Status Read command is not protected with respect to both of erasing and writing of data. The BPS0 representing "1" indicates that the block specified by the Block Protection Status Read command is protected with respect to both of erasing and writing of data. By referring to the Block Protection Status bits read by the Get Feature command, the host device 500 can determine the presence or absence of protection of the target block.

FIG. 26 is a time chart of each signal on the SPI bus during performing step S14 in FIG. 23. As shown, the host device 500 asserts the signal/CS, issues a Block Protection Status Read command "12h" as the signal SI, and further inputs the clock SCK.

Subsequently, the host device 500 transmits a dummy bit DMY_BIT to the controller 200 for eight clock cycles, for example, and transmits an address ADD to the controller for 16 cycles, for example. The address ADD specifies a block for which the presence or absence of protection is to be determined.

The time chart of each signal on the SPI bus during performing step S15 in FIG. 23 is the same as that shown in FIG. 9.

The time chart of each signal on the SPI bus during performing step S16 in FIG. 23 is also the same as that shown in FIG. 9. However, an address indicating a region in the feature table where the presence or absence of protection is stored (e.g. "C8h") is set in an address following the Get Feature command, and 8-bit information including the Block Protection Status bit for a block specified in the address ADD in FIG. 26 is transmitted to the host device 500, instead of the status data ST_DAT transmitted to the host device 500. As long as the clock SCK is input, the information is transmitted to the host device 500 repeatedly. In other words, the Block Protection Status bit for the same block is transmitted to the host device 500 repeatedly.

1.4 Advantage of Embodiment

According to the present embodiment, the host device 500 can determine the presence or absence of block protection. The advantage of the present embodiment will be described below.

When a block is protected, if information which block is protected is not stored, it is impossible to identify the protected block later. For example, as a method for identifying a protected block, it is conceivable that a write command or an erase command is issued to a block that is to be confirmed for the presence or absence of protection, and whether the processing of the write command or the erase command has failed (fail) is determined. However, according to this method, it is not possible to determine whether the processing has failed because of the block protection, or because of other reasons.

In this respect, according to the configuration of the present embodiment, the presence or absence of block protection itself can be determined directly. Therefore, it is not necessary for the host device 500 to record information as to which block is protected.

2. Variations

In the embodiment described above, the presence or absence of protection is in common with respect to a write command and an erase command; for example, if protection with respect to a write command is effective, protection with respect to an erase command is also effective. However, without being limited to this example, the presence or absence of protection with respect to a write command may be different from that of an erase command. FIG. 27 shows a variation of the feature table. As compared with FIG. 24, in a feature table in FIG. 27, BPS1 that is a Block Protection Status bit is added to the first bit. FIG. 28 shows the definition of the BPS1 and BPS0. In FIG. 28, the BPS1 representing "1" indicates that protection with respect to a write command is effective, and the BPS1 representing "0" indicates that protection with respect to a write command is not effective. In addition, the BPS0 representing "1" indicates that protection with respect to an erase command is effective, and the BPS0 representing "0" indicates that protection with respect to an erase command is not effective. In this way, a plurality of Block Protection Status bits may be provided so that each bit indicates the presence or absence of protection for different processing.

In addition, the embodiment described above shows an example in which the Block Protection Status bit for the same block is transmitted to the host device 500 repeatedly as a response to the Get Feature command, but the present disclosure is not limited thereto. For example, the Block Protection Status bit of a block specified by the Block Protection Status Read command may be initially transmitted, and then, the Block Protection Status bits of other blocks having addresses that are contiguous to the address of the block specified by the Block Protection Status Read command may be sequentially transmitted in order of the block addresses. With this configuration, when the addresses of the blocks to be confirmed are continuous, the presence or absence of protection for a plurality of blocks can be confirmed without repeatedly issuing a Block Protection Status Read command and a Get Feature command to each of a plurality of blocks.

Further, the above embodiment shows an example in which an address of a region in the feature table where a status indicating success (pass)/failure (fail) of the processing of a write command or an erase command is stored is different from an address of a region in the feature table where a Block Protection Status bit is stored, but the present disclosure is not limited thereto. A status indicating success (pass)/failure (fail) and information indicating whether a block to be processed is protected may be stored together in a region in the feature table to which the same address is assigned. In this case, if processing has failed, by referring to information indicating whether the block is protected, which is read in conjunction with a status indicating failure, whether the failure of the processing is caused by protection can be recognized, without having to issue an additional command.

Further, the above embodiment shows an example in which a block is protected in response to a command from the host device 500, but the present disclosure is not limited thereto. For example, a particular block may be protected in advance by a manufacturer of the memory system 1 before shipment to a user of the memory system 1. Also in this case, it is possible to identify a block that is protected when the host device 500 issues a command.

Note that the embodiment is not limited to the above, and various modifications are possible. For example, in the above embodiment, the NAND flash memory 100 and the controller 200 are separate semiconductor chips. However, the NAND flash memory 100 and the controller 200 may be formed by one chip.

Figure 29:
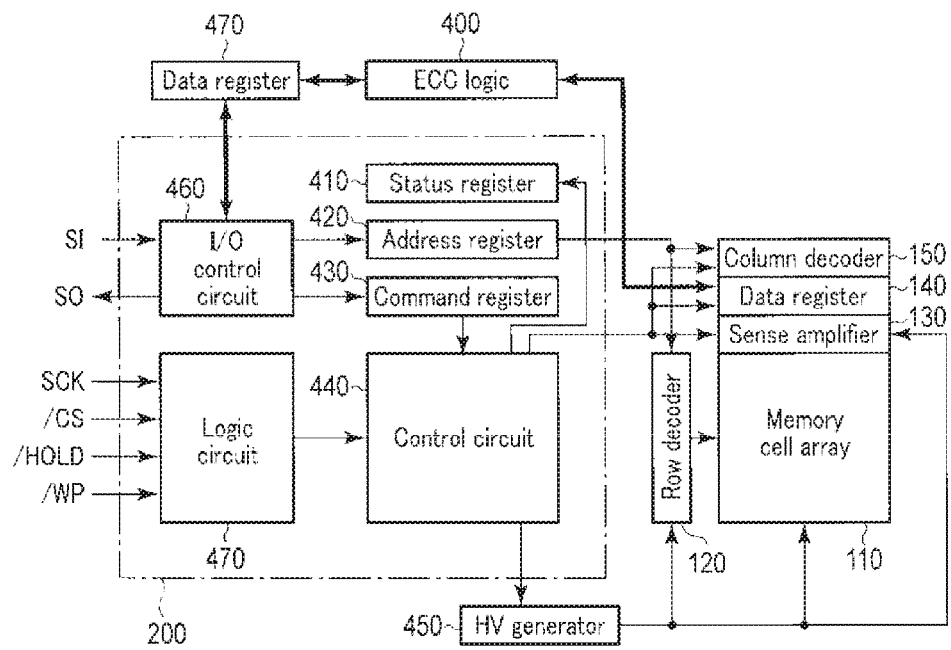
FIG. 29 is a block diagram of the memory system according to the variation of the first embodiment.

A block diagram of the memory system 1 in this case is shown in FIG. 29.

As shown, although a block configuration is similar to that in FIG. 7, signals SCK, /CS, /HOLD and /WP from the host device 500 are input to the logic circuit 470, and signals SI and SO are input/output through the input/output control circuit 460. Further, the registers 410 to 430, the control circuits 440 and 460, and the logic circuit 470 function as the controller 200. That is, the control circuit 440 functions as the sequencer 250 and the host interface circuit 220 to determine the instruction from the host device 500 with the signal/CS. The input/output control circuit 460 and the logic circuit 470 function as the host input/output circuit 210. The registers 410 and 420 function as the registers 280 and 290, and the feature table is held in, for example, the status register 410 or the like.

Further, the order of processing in the flowchart described in the above embodiment can be interchanged. For example, the Get feature command described in FIG. 19 and the like may be issued at any time; for example, it may be issued before the processing of step S10 is performed.

Further, the timing charts described in the above embodiment are also only an example, and the number of clocks necessary for the input of the signal SI, and the number of clocks necessary for the output of the signal SO are not limited to the above embodiment. In addition, in regard to some commands, an example in which a dummy bit is input immediately thereafter is shown, but the present disclosure is not limited thereto. The same applies to the feature table, without limited to the format described in the above embodiment, as long as information described in the above embodiment can be held.

Figure 30:
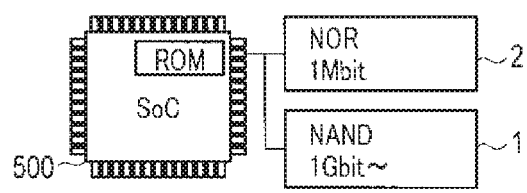
FIG. 30 is a conceptual diagram of a system utilizing the memory system according to the first embodiment.

Moreover, the memory system described in the above embodiment may also be used to start an application such as a television, a set-top box and the like. FIG. 30 shows an example of such a system. In this example, in addition to the memory system 1, a NOR flash memory 2 is provided, and the memory system 1 and the NOR flash memory 2 are connected together by an SPI interface. In this example, commands for controlling the memory system 1 (command CMD_RD1, CMD_RD2, CMD_GF, CMD_SF and the like) are held in the NOR flash memory 2. Then, when the host device 500 is started, the host device 500 reads the command information from the NOR flash memory 2 by a sequence held by the ROM in the host device 500. Then, by using this command information, the host device 500 reads a starting sequence from the memory system 1, and when the sequence is performed, the application is launched.

Figure 31:
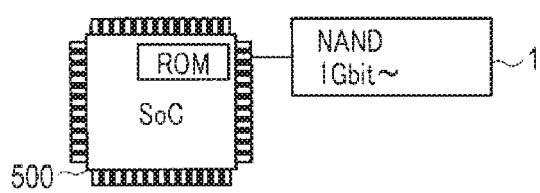
FIG. 31 is a conceptual diagram of another system utilizing the memory system according to the first embodiment.

Alternatively, if the command information of the memory system 1 is held in the ROM of the host device 500, the NOR flash memory 2 may be omitted, as shown in FIG. 31.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modifications as would fall within the scope and spirit of the inventions.

What is claimed is:

1. A memory system comprising:
a controller that recognizes, as a command, a signal received immediately after a chip select signal is received from a host device; and
a memory that includes a plurality of blocks,
wherein the controller includes a storage area in which block protection information for the plurality of blocks is maintained, and
wherein, when the command is a first command, the controller outputs to the host device, information indicating whether at least one of a write operation and an erase operation with respect to at least one particular block of the plurality of blocks is prohibited, the controller determining the information based on the block protection information maintained in the storage area of the controller, and when the command is a second command, the controller, in response to the second command, determines whether a block specified by the host device with the second command corresponds to a protectable user block, updates the block protection information maintained in the storage area of the controller to prohibit at least one of a write operation or an erase operation with respect to the block specified by the host device with the second command upon determining that the block specified by the host device with the second command corresponds to a protectable user block, and does not update the block protection information maintained in the storage area of the controller upon determining that the block specified by the host device with the second command does not correspond to a protectable user block, wherein the memory does not maintain a copy of the block protection information.

2. The memory system according to claim 1, wherein the second command includes an address of the particular block.

3. The memory system according to claim 2, wherein in response to the first command, the controller additionally outputs the information for a plurality of blocks having addresses that are contiguous to the address of the particular block.

4. The memory system according to claim 1, wherein the information indicates whether the write operation is prohibited, and whether the erasing operation is prohibited.

5. The memory system according to claim 1, wherein the signal is received in synchronism with a next clock signal following the chip select signal.

6. The memory system according to claim 5, wherein the host interface circuit is an SPI interface circuit.

7. A memory system comprising:
a nonvolatile semiconductor memory including a plurality of blocks;
a host interface circuit having no more than eight pins connectable to a host; and
a memory controller including a storage area in which block protection data indicative of whether or not a particular block of the plurality of blocks is protected from writing or erasing is maintained, the memory controller configured to output the block protection data to the host through the host interface circuit in response to a first command received from the host through the host interface circuit, wherein
in response to a second command received from the host through the host interface circuit, the memory controller determines whether a block specified by the host device with the second command corresponds to a protectable block, updates the block protection data maintained in the storage area of the memory controller to prohibit at least one of a write operation or an erase operation with respect to the block specified by the host device with the second command upon determining that the block specified by the host device with the second command corresponds to a protectable block, and does not update the block protection data maintained in the storage area of the memory controller upon determining that the block specified by the host device with the second command does not correspond to a protectable block,
wherein the nonvolatile semiconductor memory does not maintain a copy of the block protection information.

8. The memory system according to claim 7, wherein the first command includes an address of the particular block.

9. The memory system according to claim 7, wherein the memory controller is configured to store block protection data for another block of the plurality of blocks in the storage area in response to the second command received from the host through the host interface circuit, the second command including an address of said another block.

10. The memory system according to claim 7, wherein the block protection data includes first data indicating whether or not the particular block is protected from writing and second data indicating whether or not the particular block is protected from erasing.

11. The memory system according to claim 7, wherein the pins include a first pin for a chip select signal, a second pin for a ground connection, a third pin for a power supply connection, and a fourth pin for a serial clock signal.

12. The memory system according to claim 11, wherein the first command is received through a fifth pin of the host interface circuit in synchronism with a next serial clock signal received following the chip select signal asserted on the first pin.

13. The memory system according to claim 12, wherein the host interface circuit is an SPI interface circuit.

14. A memory system comprising:
a controller that recognizes, as a command, a signal received immediately after a chip select signal is received from a host device; and
a memory that includes a plurality of blocks,
wherein the controller includes a block protection register in which block protection information for the plurality of blocks is stored and a status register in which information indicating a status of the command received from the host device is stored, and
wherein, when the command is a first command, the controller outputs to the host device, information indicating whether a write or erase operation with respect to at least one particular block of the plurality of blocks has failed, when the controller determines from the block protection information stored in the block protection register of the controller that the write or erase operation is prohibited with respect to the at least one particular block, and
wherein, when the command is a second command, the controller, in response to the second command, determines whether a block specified by the host device with the second command corresponds to a protectable user block, and
(i) upon determining that the block specified by the host device with the second command corresponds to a protectable user block, updates the block protection information stored in the block protection register of the controller to prohibit the write or erase operation with respect to the block specified by the host device with the second command, and updates the status register to indicate that the second command has passed, and
(ii) upon determining that the block specified by the host device with the second command does not correspond to a protectable user block, does not update the block protection information stored in the block protection register of the controller, and updates the status register to indicate that the second command has failed.

* * * * *